United States Patent [19]
Ho et al.

[11] Patent Number: 5,867,421
[45] Date of Patent: Feb. 2, 1999

[54] INTEGRATED CIRCUIT MEMORY DEVICE HAVING REDUCED STRESS ACROSS LARGE ON-CHIP CAPACITOR

[75] Inventors: Michael Ho, Houston; Duy-Loan Le, Missouri City; Scott Smith, Sugar Land, all of Tex.

[73] Assignee: Texas Instruments Incorporated, Dallas, Tex.

[21] Appl. No.: 958,942

[22] Filed: Oct. 28, 1997

Related U.S. Application Data

[60] Provisional application No. 60/035,621 Oct. 31, 1996.
[51] Int. Cl.$^6$ ........................................ G11C 7/00
[52] U.S. Cl ...................... 365/149; 365/189.09; 365/200
[58] Field of Search .................................. 365/149, 200, 365/189.09, 189.11

[56] References Cited

U.S. PATENT DOCUMENTS

| | | | |
|---|---|---|---|
| 5,535,160 | 7/1996 | Yamaguchi | 365/189.09 |
| 5,659,591 | 8/1997 | Lee et al. | 365/189.09 |

*Primary Examiner*—Vu A. Le
*Attorney, Agent, or Firm*—Robby T. Holland; Carl H. Hoel; Richard L. Donaldson

[57] ABSTRACT

An integrated circuit memory device (10) includes a large on-chip capacitor (12) that has a high voltage plate and a low voltage plate. The large on-chip capacitor (12) stores charge for a positive voltage supply (VPP) for the integrated circuit memory device (10). The high voltage plate of the large on-chip capacitor (12) is connected to a node (NODE 1) for distributing charge from the large on-chip capacitor. A load (16) is connected to the node (NODE 1) and consumes charge from the high voltage plate to power operations of the integrated circuit memory device (10). The load (16) includes a memory array comprising a plurality of memory cells. The low voltage plate of the large on-chip capacitor (12) is connected to a capacitive voltage reference which has high capacitance and has a voltage-level greater than ground potential and less than the positive voltage supply. In one embodiment, the large on-chip capacitor is a storage/filter capacitor (12) for a boosted high voltage supply (VPP), and the capacitive voltage reference is a memory cell reference voltage (VPLT) which is also connected to a reference plate of memory cell capacitors (28) of the memory cells (20) in the memory array.

15 Claims, 1 Drawing Sheet

INTEGRATED CIRCUIT MEMORY DEVICE HAVING REDUCED STRESS ACROSS LARGE ON-CHIP CAPACITOR

This application is a provisional of Ser. No. 60/035,621 filed Oct. 31,1996.

TECHNICAL FIELD OF THE INVENTION

This invention relates in general to the field of integrated circuit devices, and more particularly to an integrated circuit memory device having reduced stress across a large on-chip capacitor.

BACKGROUND OF THE INVENTION

In most manufacturing processes for integrated circuit memory devices, the memory devices are subjected to a quality testing process after fabrication. In some manufacturing processes, this quality testing process includes subjecting the memory devices to a burn-in test and to an op-life test. In general, the burn-in test is designed to accelerate the failure of those memory devices that would have failed early within the device lifetime, sometimes referred to as infant-mortality. By accelerating the stress on the memory devices, the burn-in test identifies these faulty devices in a reduced time-frame. In general, the op-life test follows burn-in and is designed to accelerate the failure of memory devices at the end of the device lifetime, sometimes referred to as wear-out. Thus, the op-life test provides information about the average lifetime of the memory devices to insure the memory devices will work properly for the desired period of time.

It is desirable to stress the memory devices during burn-in such that substantially all of the memory devices that are going to fail prior to the desired device lifetime will fail during the burn-in test. However, it is undesirable to place too much stress on the memory devices during burn-in test because the yield can be reduced unnecessarily. It is also undesirable to place too little stress on the memory devices during burn-in because memory devices will fail during the op-life test and present a quality problem.

One point of failure for memory devices can be a yield loss due to failure of large on-chip capacitors such as due to current leakage from pinholes in the capacitor oxide. Memory devices often have such large storage/filter capacitors to serve to supply current and stability for a high voltage supplies. This use for voltage supplies requires such storage/filter capacitors to be as large as possible in order to produce stability in the supplied voltage level. For example, one such storage/filter capacitor can be used for an internal boosted voltage level, VPP, to drive word line and sense amplifier selection. In some memory device designs, the high voltage plate of this storage/filter capacitor is connected to a node supplying the high voltage level, VPP, and the low voltage plate is connected to ground potential, VSS. Because of the large voltage difference between VPP and VSS, the storage/filter capacitor can see stress during burn-in test that exceeds the stress seen by other structures in the memory device. This higher stress is problematic in that it can produce unnecessary failure of memory devices during burn-in test.

It is desirable to reduce unnecessary failure of memory devices caused by large on-chip capacitors being over-stressed during burn-in test of the memory devices. In particular, it is desirable to reduce unnecessary failure caused by stress on high voltage storage/filter capacitors in the memory device. Conventional solutions to this problem include connecting the low voltage plate of the high voltage storage/filter capacitor to a positive external power supply. This reduces the voltage across the storage/filter capacitor which lowers the stress on the capacitor. However, this solution causes stability problems due to slew in the external voltage power supply and causes quality problems due to understressing of the storage/filter capacitor during burn-in test.

SUMMARY OF THE INVENTION

In accordance with the present invention, an integrated circuit memory device having reduced stress across a large on-chip capacitor is provided that substantially eliminates or reduces disadvantages and problems associated with previously developed integrated circuit memory devices.

According to one aspect of the present invention, an integrated circuit memory device is provided that includes a large on-chip capacitor that has a high voltage plate and a low voltage plate. The large on-chip capacitor stores charge for a positive voltage supply for the integrated circuit memory device. The high voltage plate of the large on-chip capacitor is connected to a node for distributing charge from the large on-chip capacitor. A load is connected to that node and consumes charge from the high voltage plate to power operations of the integrated circuit memory device. The load can include a memory array comprising a plurality of memory cells. The low voltage plate of the large on-chip capacitor is connected to a capacitive voltage reference which has high capacitance and has a voltage level greater than ground potential and less than the positive voltage supply. In one embodiment, the large on-chip capacitor is a storage/filter capacitor for a boosted high voltage supply, and the capacitive voltage reference is a memory cell reference voltage which is also connected to a reference plate of memory cell capacitors of the memory cells in the memory array.

A technical advantage of the present invention is improving the yield for manufacturing integrated circuit memory devices by reducing the voltage across large on-chip capacitors using a high capacitance on-chip voltage source. In particular, the stress across a high voltage storage/filter capacitor is reduced thus decreasing overstress during burn-in test of the memory devices and reducing life-time wear out.

Another technical advantage of the present invention is the lowering of the voltage across a VPP capacitor in an integrated circuit memory device by connecting an output of a VPLT generator to the low voltage plate of the VPP capacitor. Because the VPLT reference is a highly capacitive signal, it serves as a relatively stable reference node to the VPP capacitor. In this manner, both yield and process reliability are improved.

BRIEF DESCRIPTION OF THE DRAWINGS

A more complete understanding of the present invention and advantages thereof may be acquired by referring to the following description taken in conjunction with the accompanying drawings in which like reference numbers indicate like features, and wherein.

DETAILED DESCRIPTION OF THE INVENTION

Figure 1A:
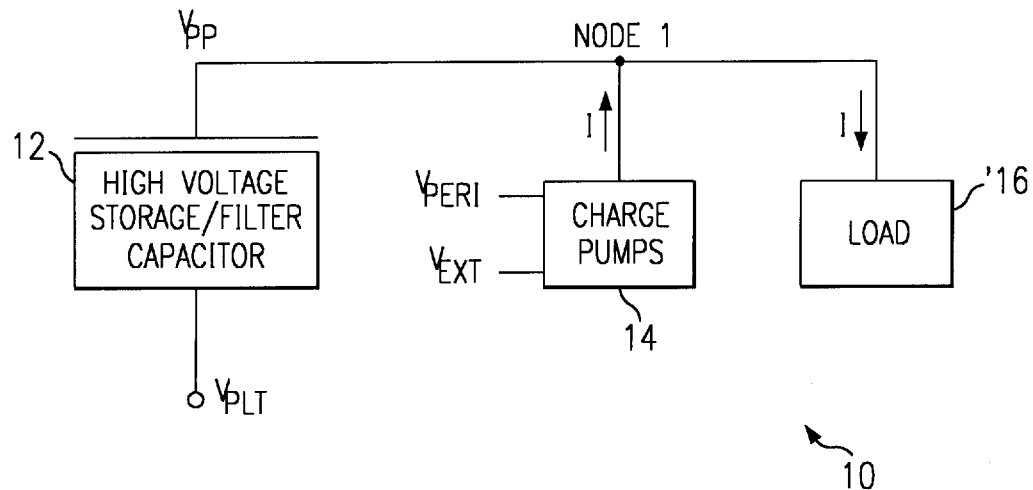
FIG. 1A is a block diagram of one embodiment of an integrated circuit memory device having reduced stress across a large on-chip capacitor.
Figure 1B:
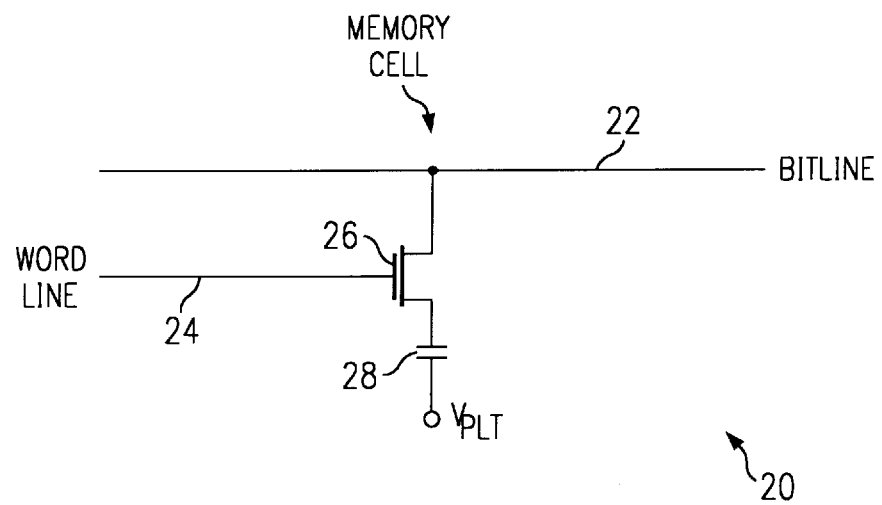
FIG. 1B is a circuit diagram of one embodiment of a memory cell in an integrated circuit memory device to which the large on-chip capacitor of FIG. 1A is connected.

FIG. 1A is a block diagram of one embodiment of an integrated circuit memory device, indicated generally at 10, having reduced stress across a large on-chip capacitor. In this embodiment, memory device 10 includes a large on-chip capacitor that is a high voltage storage/filter capacitor 12. In one implementation, storage/filter capacitor 12 is formed with an n-well in a p-type substrate serving as the low voltage capacitor plate and with a conductive layer, such as polysilicon, deposited above an oxide layer serving as the high voltage plate. As shown, the high voltage plate of storage/filter capacitor 12 is connected to a node, NODE 1, that serves as a high voltage supply, VPP, for memory device 10. The low voltage plate of storage/filter capacitor 12 is connected to a high capacitance on-chip voltage source. In the embodiment of FIG. 1A, this voltage source is a memory cell plate reference voltage, VPLT. The memory cell reference voltage, VPLT, is connected to drive the reference side of capacitors in the memory cells in memory device 10. FIG. 1B shows one embodiment of a memory cell and the connection to memory cell reference voltage, VPLT. Because memory cell reference level, VPLT, is connected to all of the memory cell capacitors in memory device 10, memory cell reference level, VPLT, has a high capacitance and provides a relatively stable reference for the low voltage plate of storage/filter capacitor 12.

In the embodiment of FIG. 1A, memory device 10 also includes charge pumps 14 which are connected to and provide current to NODE 1 in order to maintain voltage supply, VPP. Other circuits for replenishing the charge on storage/filter capacitor 12 could also be used. As shown in FIG. 1A, charge pumps 14 receive an internal chip voltage supply, VPERI, and receive an external voltage supply, VEXT. In this embodiment, VPERI and VEXT have substantially the same voltage level where VPERI is generated internally based upon the external power supply, VEXT. Memory device 10 further includes a load 16 which is connected to and draws current from NODE 1. Load 16 represents the active devices in memory device 10 that use VPP as a power supply. Load 16 can include the array of memory cells and logic and control circuitry for memory device 10. In one embodiment, voltage supply, VPP, can be used as an internal boosted voltage level to drive word line and sense amplifier selection.

In operation, memory device 10 includes a boosted power supply, VPP, produced by charge pumps 14 and storage/filter capacitor 12. Charge pumps 14 supply current to charge storage/filter capacitor 12 and storage/filter capacitor 12 stores charge so the voltage level, VPP, remains steady when current is pulled by load 16. The larger the size of storage/filter capacitor 12, the better the storage/filter capacitor 12 operates. For this reason, memory device 10 is generally formed such that storage filter/capacitor 12 is as large as possible. Because of the size-of storage/filter capacitor 12, there is a higher probability that material defects will appear within storage/filter capacitor 12 in comparison with other structures in memory device 10. High voltages across storage/filter capacitor 12 can overstress the capacitor's dielectric. In addition, any material defects in the dielectric can make storage/filter capacitor 12 even more susceptible to failure.

In the embodiment of FIG. 1A, the low voltage plate of storage/filter capacitor 12 is connected to the memory cell reference voltage, VPLT, to provide the low voltage plate with a large, stable DC voltage level having a large capacitance. By connecting the low voltage plate to VPLT rather than to ground potential, VSS, the stress across storage/filter capacitor 12 is reduced significantly during burn-in and op-life testing as well as during normal operation. This decrease in stress operates to equalize the stress on storage/filter capacitor 12 with reference to other capacitor and transistor structures in memory device 10. The equalization of stress has been shown to produce a two to three percent improvement in yield for some integrated circuit memory devices. This improvement in yield can be achieved without a decrease in performance or quality. Connecting the low voltage plate of storage/filter capacitor 12 to the memory cell reference voltage, VPLT, therefore provides significant advantages over conventional memory device designs. In addition to the ability to improve yield without loss in performance or quality, there is also an ability to test storage/filter capacitor 12 by changing the reference voltage VPLT. This is possible because on many integrated circuit memory devices, the value of VPLT is externally changeable via special test modes.

FIG. 1B is a circuit diagram of one embodiment of a memory cell, indicated generally at 20, in memory device 10 to which storage/filter capacitor 12. As shown, memory cell 20 is connected to a bit line 22 and a word line 24. Memory cell 20 includes a transistor 26 having its drain connected to bit line 22, its gate connected to word lines 24 and its source connected to the high voltage plate of a memory cell capacitor 28. The reference plate of memory cell capacitor 28 is connected to the memory cell reference voltage, VPLT. As discussed above, memory cell reference voltage, VPLT, has a high capacitance because it is connected to the low voltage plate of each memory cell capacitor 28 of memory cells 20 in the memory array. For this reason, the voltage level VPLT is particularly suitable for connection to the low voltage capacitor plate of storage/filter capacitor 12. It should be understood, depending upon the design if a memory device, that similar advantages could be produced by using other positive reference voltages in the memory device that are highly capacitive.

In one embodiment of the present invention, memory device 10 comprises a DRAM memory device that operates with a 5 volt external supply voltage. In this embodiment, memory device 10 is a regulated device such that the internal voltage supply, VPERI, is regulated. In this device, the voltage level, VPERI, is reduced from the external voltage supply and is typically 3.3 volts, and the high voltage supply, VPP, is boosted to 5.4 volts. Further, the memory device uses an array voltage, VARY, equal to 3.3 volts, and the memory cell reference voltage, VPLT, is typically one-half of VARY, or 1.65 volts. The stress across the VPP capacitor is important because it is a large area structure and sees a stress field over a 100% duty cycle at burn-in test. The following table provides a comparison of stress levels across different transistors/capacitors in such an memory device. Memory devices can experience significant improvement in yields because an absolute electric field stress across the VPP capacitor during burn-in test is reduced, for example, from 6.2 Mv/cm to 3.7 Mv/cm. It should be understood that the relative op-life test versus use stress levels are also significantly reduced.

The above discussion has focused on an embodiment of a high voltage memory device. For low voltage memory devices, there is not typically a regulated power supply. In such low voltage memory devices, it is possible that the memory cell reference voltage, VPLT, can slew with changes in the external power supply. However, it is possible in such devices to clamp the level of the memory cell reference voltage, VPLT, so that it does not rise above a desired voltage level. For example, the voltage level could be clamped using two diodes such that the voltage level does not slew above two threshold voltages.

Although the present invention has been described in detail, it should be understood that various changes, substitutions and alterations can be made thereto without departing from the spirit and scope of the invention as defined by the appended claims.

What is claimed is:

1. An integrated circuit memory device, comprising:
   a large on-chip capacitor having a high voltage plate and a low voltage plate, the large on-chip capacitor storing charge for a positive voltage supply for the integrated circuit memory device, the high voltage plate connected to a node for distributing charge from the large oii-chip capacitor; and
   a load connected to the node and consuming charge from the high voltage plate to power operations of the integrated circuit memory device, the load including a memory array comprising a plurality of memory cells;
   the low voltage plate of the large on-chip capacitor connected to a capacitive voltage reference having high capacitance and having a voltage level greater than ground potential and less than the positive voltage supply.

2. The integrated circuit memory device of claim 1, wherein the capacitive voltage reference is a memory cell reference voltage which is connected to a reference plate of memory cell capacitors of the memory cells in the memory array.

3. The integrated circuit memory device of claim 1, further comprising a circuit for replenishing charge on the large on-chip capacitor, the circuit connected to the high voltage plate of the large on-chip capacitor and operable to supply current to maintain the voltage level of the positive voltage supply.

4. The integrated circuit memory device of claim 3, wherein the circuit for replenishing charge on the large on-chip capacitor is a charge pump.

5. The integrated circuit memory device of claim 3, wherein the large on-chip capacitor is a storage/filter capacitor for a boosted high voltage supply and wherein the capacitive voltage reference is a memory cell reference voltage which is also connected to a reference plate of memory cell capacitors of the memory cells in the memory array.

6. The integrated circuit memory device of claim 1, wherein the positive voltage supply is a boosted high voltage supply.

7. The integrated circuit memory device of claim 1, wherein the integrated circuit memory device is a DRAM device.

8. An integrated circuit memory device, comprising:
   a storage/filter capacitor for a boosted high voltage supply having a high voltage plate and a low voltage plate, the storage/filter capacitor storing charge for a boosted high voltage supply for the integrated circuit memory device, the high voltage plate connected to a node for distributing charge from the large on-chip capacitor;
   a charge pump connected to the node and operable to supply current in order to maintain the voltage level of the positive voltage supply; and
   a load connected to the node and consuming charge from the high voltage plate to power operations of the integrated circuit memory device, the load including a memory array comprising a plurality of memory cells;
   the low voltage plate of the storage/filter capacitor connected to a memory cell reference voltage which is connected to a reference plate of memory cell capacitors of the memory cells.

9. The integrated circuit memory device of claim 8, wherein the integrated circuit memory device is a DRAM device.

10. A method for reducing stress across a large on-chip capacitor in an integrated circuit memory device, comprising:
    connecting a high voltage plate of a large on-chip capacitor to a node for distributing charge from the large on-chip capacitor, the large on-chip capacitor storing charge for a positive voltage supply for the integrated circuit memory device;
    connecting a load to the node, the load consuming charge from the high voltage plate to power operations of the integrated circuit memory device, and the load including a memory array comprising a plurality of memory cells;
    connecting the low voltage plate of the large on-chip capacitor to a capacitive voltage reference having high capacitance and having a voltage level greater than ground potential and less than the positive voltage supply.

11. The method of claim 10, wherein the capacitive voltage reference is a memory cell reference voltage, and further comprising connecting the memory cell reference voltage to a reference plate of memory cell capacitors of the memory cells in the memory array.

12. The method of claim 10, further comprising connecting a circuit for replenishing charge on the large on-chip capacitor to the high voltage plate of the large on-chip capacitor, the circuit operable to supply current to maintain the voltage level of the positive voltage.

13. The method of claim 12, wherein the circuit for replenishing charge on the large on-chip capacitor is a charge pump.

14. The method of claim 10, wherein the large on-chip capacitor is a storage/filter capacitor for a boosted high voltage supply and wherein the capacitive voltage reference is a memory cell reference voltage, and wherein the memory cell reference voltage is connected to a reference plate of memory cell capacitors of the memory cells in the memory array.

15. The method of claim 10, wherein the integrated circuit memory device is a DRAM device.

\* \* \* \* \*